United States Patent
Kondo et al.

(10) Patent No.: US 10,368,408 B2
(45) Date of Patent: Jul. 30, 2019

(54) LIGHT EMITTING DEVICE AND LED LIGHT BULB

(71) Applicants: Toshiba Materials Co., Ltd., Yokohama-Shi (JP); Phoenix Electric Co., Ltd., Himeji-Shi (JP)

(72) Inventors: Hiroyasu Kondo, Yokohama (JP); Masahiko Yamakawa, Yokohama (JP); Yasuhiro Shirakawa, Yokohama (JP); Ryoji Tsuda, Yokohama (JP); Atsuji Nakagawa, Himeji (JP); Toshitaka Fujii, Himeji (JP); Tomohiko Inoue, Himeji (JP)

(73) Assignee: Toshiba Materials Co., Ltd., Yokohama-Shi (JP)

( * ) Notice: Subject to any disclaimer, the term of this patent is extended or adjusted under 35 U.S.C. 154(b) by 0 days.

(21) Appl. No.: 15/259,481

(22) Filed: Sep. 8, 2016

(65) Prior Publication Data

US 2017/0048941 A1    Feb. 16, 2017

Related U.S. Application Data

(63) Continuation of application No. PCT/JP2015/001512, filed on Mar. 18, 2015.

(30) Foreign Application Priority Data

Mar. 20, 2014  (JP) ................. 2014-057335

(51) Int. Cl.
*H05B 33/08* (2006.01)
*F21K 9/232* (2016.01)
(Continued)

(52) U.S. Cl.
CPC ...... *H05B 33/0827* (2013.01); *C09K 11/0883* (2013.01); *C09K 11/665* (2013.01);
(Continued)

(58) Field of Classification Search
CPC .............. F21Y 2101/00; F21Y 2115/10; F21Y 2107/40; F21Y 2113/13; F21Y 2113/17;
(Continued)

(56) References Cited

U.S. PATENT DOCUMENTS 8,791,642 B2 * 7/2014 van de Ven ........ H05B 33/0824
315/192
8,796,952 B2 * 8/2014 van de Ven ........ H05B 33/0827
315/297

(Continued)

FOREIGN PATENT DOCUMENTS

JP    2007-299590 A1    11/2007
JP       4862098 B1     1/2012
(Continued)

OTHER PUBLICATIONS

LEDTuning.nl, CIE Converter, https://www.ledtuning.nl/en/cie-convertor, accessed Dec. 26, 2017.*
(Continued)

*Primary Examiner* — Tung X Le
*Assistant Examiner* — Borna Alaeddini

(57) ABSTRACT

A light emitting device includes: a first white light source which includes N pieces of first white light emitting diodes and emits a first white light; and a second white light source which includes M pieces of second white light emitting diodes and a first resistance element electrically connected in series to the second white light emitting diodes and having a first resistance value, is electrically connected in parallel to the first white light source, and emits a second white light, the light emitting device emitting a mixed white light of the first white light and the second white light. The drive voltage of the first white light source is higher than a drive voltage (Continued)

of the second white light source, and a color temperature of the mixed white light is higher as a total luminous flux of the mixed white light is higher.

14 Claims, 10 Drawing Sheets

(51) Int. Cl.
  *F21K 9/238*   (2016.01)
  *F21K 9/235*   (2016.01)
  *C09K 11/08*   (2006.01)
  *C09K 11/66*   (2006.01)
  *C09K 11/77*   (2006.01)
  *F21V 3/02*   (2006.01)
  *F21V 23/00*   (2015.01)
  *H01L 33/50*   (2010.01)
  *H01L 25/075*  (2006.01)
  *H01L 25/16*   (2006.01)
  *F21Y 103/10*  (2016.01)
  *F21Y 115/10*  (2016.01)

(52) U.S. Cl.
  CPC ........ *C09K 11/778* (2013.01); *C09K 11/7734* (2013.01); *C09K 11/7739* (2013.01); *C09K 11/7787* (2013.01); *C09K 11/7789* (2013.01); *F21K 9/232* (2016.08); *F21K 9/235* (2016.08); *F21K 9/238* (2016.08); *F21V 3/02* (2013.01); *F21V 23/005* (2013.01); *H01L 33/504* (2013.01); *H05B 33/0821* (2013.01); *H05B 33/0845* (2013.01); *H05B 33/0857* (2013.01); *F21Y 2103/10* (2016.08); *F21Y 2115/10* (2016.08); *H01L 25/0753* (2013.01); *H01L 25/167* (2013.01); *H01L 2924/0002* (2013.01); *Y02B 20/181* (2013.01); *Y02B 20/341* (2013.01)

(58) Field of Classification Search
  CPC ............ H05B 33/0809; H05B 33/0815; H05B 33/0803; H05B 33/0845; H05B 33/0857; H05B 33/086
  See application file for complete search history.

(56) References Cited

U.S. PATENT DOCUMENTS

| | | | |
|---|---|---|---|
| 8,847,513 B2* | 9/2014 | Van De Ven | H05B 33/086 315/307 |
| 2007/0236159 A1* | 10/2007 | Beland | H05B 33/0803 315/312 |
| 2009/0296384 A1* | 12/2009 | Van De Ven | H05B 33/0803 362/231 |
| 2011/0115407 A1 | 5/2011 | Wibben et al. | |
| 2011/0175528 A1* | 7/2011 | Rains, Jr. | F21V 3/00 315/51 |
| 2011/0249431 A1 | 10/2011 | Tanaka | |
| 2012/0146066 A1* | 6/2012 | Tischler | H01L 27/156 257/89 |
| 2012/0286669 A1 | 11/2012 | Yan et al. | |
| 2012/0286699 A1 | 11/2012 | Yan et al. | |
| 2013/0001628 A1* | 1/2013 | Yamakawa | C09K 11/0883 257/98 |
| 2013/0049632 A1* | 2/2013 | Kim | H05B 33/0803 315/294 |
| 2013/0063035 A1* | 3/2013 | Baddela | H05B 33/086 315/192 |
| 2013/0100645 A1 | 4/2013 | Ooya et al. | |
| 2013/0141013 A1* | 6/2013 | Kodama | H05B 33/0857 315/294 |
| 2013/0228804 A1 | 9/2013 | Yan | |
| 2014/0084796 A1 | 3/2014 | Yan et al. | |
| 2014/0232288 A1* | 8/2014 | Brandes | H05B 33/0803 315/250 |

FOREIGN PATENT DOCUMENTS

| | | | |
|---|---|---|---|
| JP | 2012-113958 A1 | 6/2012 | |
| JP | 2012-199218 A1 | 10/2012 | |
| JP | 2012-238596 A1 | 12/2012 | |
| WO | 2012/044223 A1 | 4/2012 | |
| WO | WO 2012044223 A1 * | 5/2012 | |

OTHER PUBLICATIONS

Wikipedia, Color Temperature, https://en.wikipedia.org/wiki/Color_temperature, accessed Dec. 26, 2017.*
International Search Report and Written Opinion (Application No. PCT/JP2015/001512) dated Apr. 21, 2015.
English translation of International Preliminary Report on Patentability (Chapter I) (Application No. PCT/JP2015/001512) dated Sep. 29, 2016.
Extended European Search Report, European Application No. 15764967.4, dated Oct. 27, 2017 (9 pages).

* cited by examiner

_US 10,368,408 B2_

LIGHT EMITTING DEVICE AND LED LIGHT BULB

CROSS-REFERENCE TO RELATED APPLICATIONS

This application is a continuation of prior International Application No. PCT/JP2015/001512 filed on Mar. 18, 2015, which is based upon and claims the benefit of priority from Japanese Patent Application No. 2014-057335 filed on Mar. 20, 2014; the entire contents of all of which are incorporated herein by reference.

FIELD

Embodiments described herein relate generally to a light emitting device and an LED light bulb.

BACKGROUND

A light emitting device including a light emitting diode (LED) is used for lighting devices such as a liquid crystal display backlight, a signal device, various kinds of switches, a lamp for vehicles, and general lighting, for instance. In particular, a white light source composed of the combination of LED and a phosphor is drawing attention as a substitute for an incandescent light bulb, and for example, an LED light bulb having the same shape as that of the incandescent light bulb is known. The LED light bulb has, for example, an integrated lamp structure including a base portion, a lamp cap provided on the base portion, a globe, an LED chip disposed in the globe and having a white light emitting diode, and an LED chip lighting circuit provided in the base portion. In this case, the lamp cap is electrically connected to the base portion.

Brightness of an incandescent light bulb is adjusted according to user's preference. For example, when the brightness is adjusted to a darker side, an emitted light tends to be a reddish white light and also to have a lower color temperature due to an emission characteristic of a tungsten filament. The emission characteristic of the incandescent light bulb to thus vary in color temperature with brightness is unconsciously accepted by people, and accordingly a newly proposed light emitting device is required to have the same emission characteristic as that of the incandescent light bulb.

In the conventional light emitting device, however, it is difficult to vary brightness such as the total luminous flux as the color temperature of the white light varies, though the brightness of the white light is adjustable at the same color temperature. For example, in a conventional white light source which produces a white light by the combination of LED and a phosphor, even when the brightness of the LED is adjusted, the color temperature of the white light does not vary. Accordingly, in order to vary the emission color, changing the kind of the phosphor or the kind of the LED has been required.

DETAILED DESCRIPTION

A light emitting device of an embodiment includes: a first white light source which includes N pieces (N is a natural number equal to or more than 2) of first white light emitting diodes electrically connected in series to one another and emits a first white light having a first color temperature; and a second white light source which includes M pieces (M is a natural number less than N) of second white light emitting diodes electrically connected in series to one another and a first resistance element electrically connected in series to the second white light emitting diodes and having a first resistance value, is electrically connected in parallel to the first white light source, and emits a second white light having a second color temperature lower than the first color temperature, the light emitting device emitting a mixed white light of the first white light and the second white light. A drive voltage of the first white light source is higher than a drive voltage of the second white light source. A color temperature of the mixed white light is higher as a total luminous flux of the mixed white light is higher.

Embodiments will be hereinafter described with reference to the drawings. Note that the drawings are schematic, and for example, a relation of the thickness and the planar dimension, a thickness ratio among layers, and so on may differ from actual ones. In the embodiments, substantially the same constituent elements are denoted by the same reference signs and a description thereof will be omitted.

First Embodiment

Figure 1:
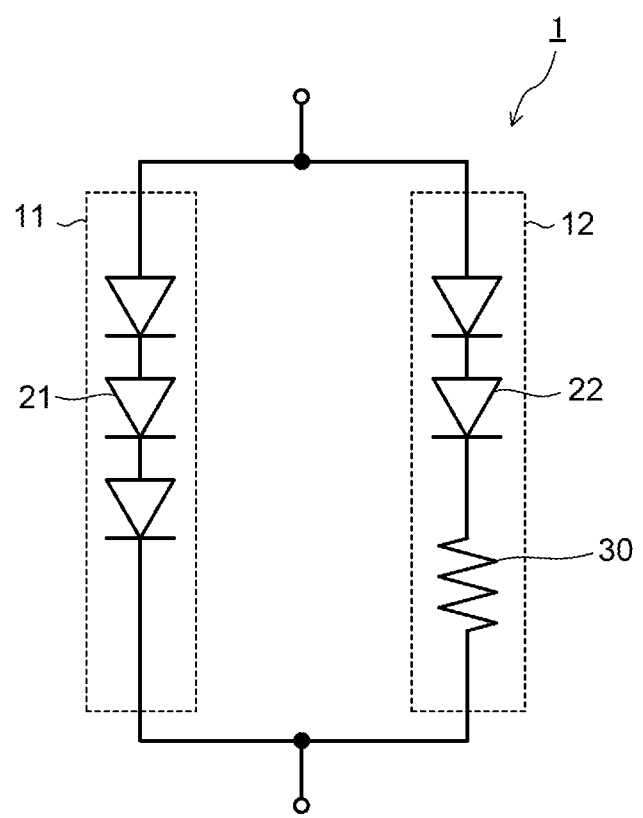
FIG. 1 is a circuit diagram illustrating an example of the circuit configuration of a light emitting device.

FIG. 1 is a circuit diagram illustrating the circuit configuration of a light emitting device. The light emitting device 1 illustrated in FIG. 1 includes: a white light source 11 which emits a first white light having a first color temperature; and a white light source 12 which emits a second white light having a second color temperature lower than the first color temperature. The light emitting device 1 has a function of emitting a mixed white light of the first white light and the second white light. The white light source 11 and the white light source 12 can be supplied with a current by the same power supply circuit, for instance.

The white light source 12 is electrically connected in parallel to the white light source 11. Owing to the different color temperatures that the first white light and the second white light have, the mixed white light can have different color temperatures depending on emission states of the white light source 11 and the white light source 12. For example, in the CIE chromaticity diagram, a Cx difference between the first white light and the second white light is preferably 0.04 or more, and a Cy difference therebetween is preferably 0.001 or more.

A drive voltage of the white light source 11 is higher than a drive voltage of the white light source 12. Accordingly, an amount of a current supplied to the light emitting device 1 increases, and it is possible to equalize a voltage applied to the white light source 11 and a voltage applied to the white light source 12 to obtain a point of inflection in a current-voltage characteristic of the whole light emitting device 1. Note that the drive voltage refers to a voltage having a value necessary for causing the light emission of the white light source (the light emission of white light emitting diodes).

The white light source 11 includes N pieces (N is a natural number equal to or more than 2) of white light emitting diodes 21. The N pieces of white light emitting diodes 21 are electrically connected in series to one another in a forward direction. For example, an anode of the white light emitting diode 21 on the second stage is electrically connected to a cathode of the white light emitting diode 21 on the first stage. In FIG. 1, the three white light emitting diodes 21 are electrically connected in series, but the number of the white light emitting diodes electrically connected in series is not limited to this and can be appropriately set according to an emission characteristic and so on required of the white light source 11. Further, a plurality of white light emitting diode groups electrically connected in parallel may be provided, the single white light emitting diode group being composed of the white light emitting diodes 21 electrically connected in series.

The white light source 12 includes M pieces (M is a natural number less than N) of white light emitting diodes 22 and a resistance element 30. The M pieces of white light emitting diodes 22 are electrically connected in series to one another in a forward direction. For example, an anode of the white light emitting diode 22 on the second stage is electrically connected to a cathode of the white light emitting diode 22 on the first stage. In FIG. 1, the two white light emitting diodes 22 are electrically connected in series, but the number of the white light emitting diodes 22 electrically connected in series is not limited to this and can be appropriately set according to an emission characteristic and so on required of the white light source 12. Further, a plurality of white light emitting diode groups electrically connected in parallel may be provided, the single white light emitting diode group being composed of the white light emitting diodes 22 electrically connected in series.

A ratio of a drive current of the white light source 11 to a drive current of the white light source 12 is preferably 10 or more, for instance. This enables the adjustment of the color temperature of the mixed white light to a visually perceivable degree, depending on emission states of the white light source 11 and the white light source 12. The drive current refers to an amount of a current necessary for causing the light emission of the white light source (the light emission of the white light emitting diodes). A value of the drive current of the white light source can be adjusted according to, for example, the number of the white light emitting diodes electrically connected in series.

The white light emitting diodes 21 and the white light emitting diodes 22 each include, for example, a light emitting diode element and a phosphor which emits a white light by being excited by the light of the light emitting diode element.

The light emitting diode elements each emit a light having an emission peak wavelength in 370 nm to 420 nm. As the light emitting diode element, an InGaN-based, GaN-based, or AlGaN-based light emitting diode element which emits an ultraviolet to violet light is usable, for instance.

The phosphors are each used, for example, in a state of being dispersed in an organic film of a silicone resin or the like formed on the surface of the light emitting diode element. The organic film containing the dispersed phosphor is also called a phosphor film.

As the phosphor, a mixture of phosphors which emit lights of at least the three primary colors of red, green, and blue is usable, for instance. Kinds and a compounding ratio of the phosphors used for the mixed phosphor are appropriately set according to emission characteristics such as the color temperatures required of the white light source 11 and the white light source 12. Adjusting the kinds and the compounding ratio of the phosphors achieve white lights of neutral white and daylight color, for instance.

As the phosphor that emits the blue light (also called a blue phosphor), a phosphor whose emission peak wavelength is within a range of not less than 430 nm nor more than 460 nm is usable, and desirably, a europium (Eu)-activated alkaline earth chlorophosphate phosphor having the composition expressed by the formula (1) is used, for instance.

general formula: $(Sr_{1-x-y-z}Ba_xCa_yEu_z)_5(PO_4)_3 \cdot Cl$ (1)

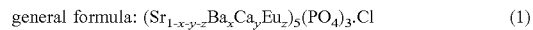

(where x, y, and z are numbers satisfying $0 \leq x < 0.5$, $0 \leq y < 0.1$, and $0.005 \leq z < 0.1$)

As the phosphor which emits the green light (also called a green phosphor), a phosphor whose emission peak wavelength is within a range of 490 nm to 580 nm is usable, and desirably, at least one kind selected from a europium (Eu)- and manganese (Mn)-activated alkaline earth aluminate phosphor having the composition expressed by the formula (2), a europium (Eu)- and manganese (Mn)-activated alkaline earth silicate phosphor having the composition expressed by the formula (3), a cerium (Ce)-activated rare-earth aluminate phosphor having the composition expressed by the formula (4), a europium (Eu)-activated sialon phosphor having the composition expressed by the formula (5), and a europium (Eu)-activated sialon phosphor having the composition expressed by the formula (6) is used, for instance.

general formula: $(Ba_{1-x-y-z}Sr_xCa_yEu_z)(Mg_{1-u}Mn_u)Al_{10}O_{17}$ (2)

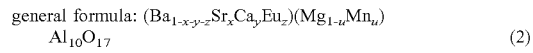

(where x, y, z, and u are numbers satisfying $0 \leq x < 0.2$, $0 \leq y < 0.1$, $0.005 < z < 0.5$, and $0.1 < u < 0.5$)

general formula: $(Sr_{1-x-y-z-u}Ba_xMg_yEu_zMn_u)_2SiO_4$ (3)

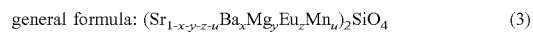

(where x, y, z, and u are numbers satisfying $0.1 \leq x \leq 0.35$, $0.025 \leq y \leq 0.105$, $0.025 \leq z \leq 0.25$, and $0.0005 \leq u \leq 0.02$)

general formula: $RE_3A_xAl_{5-x-y}B_yO_{12}:Ce_z$ (4)

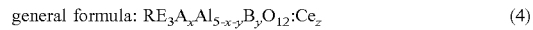

(where RE represents at least one kind of element selected from Y, Lu, and Gd, A and B are elements making a pair, (A, B) is one of (Mg, Si), (B, Sc), and (B, In), and x, y, and z are numbers satisfying $x < 2$, $y < 2$, $0.9 \leq x/y \leq 1.1$, and $0.05 \leq z \leq 0.5$)

general formula: $(Si,Al)_6(O,N)_8:Eu_x$ (5)

(where x is a number satisfying $0 < x < 0.3$)

general formula: $(Sr_{1-x}Eu_x)_\alpha Si_\beta Al_\gamma O_\delta N_\omega$ (6)

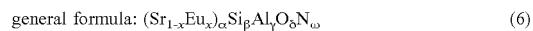

(where x, $\alpha$, $\beta$, $\gamma$, $\delta$, and $\omega$ are numbers satisfying $0 < x < 1$, $0 < \alpha \leq 3$, $12 \leq \beta \leq 14$, $2 \leq \gamma \leq 3.5$, $1 \leq \delta \leq 3$, and $20 \leq \omega \leq 22$)

As the phosphor that emits the red light (also called a red phosphor), a phosphor whose emission peak wavelength is within a range of 580 nm to 630 nm is usable, and desirably, at least one kind selected from a europium (Eu)-activated lanthanum oxysulfide phosphor having the composition expressed by the formula (7), a europium (Eu)- and bismuth (Bi)-activated yttrium oxide phosphor having the composition expressed by the formula (8), a europium (Eu)-activated CASN phosphor having the composition expressed by the formula (9), and a europium (Eu)-activated sialon phosphor having the composition expressed by the formula (10) is used, for instance.

$$\text{general formula: } (La_{1-x-y}Eu_xM_y)_2O_2S \quad (7)$$

(where M represents at least one kind of element selected from Sm, Ga, Sb, and Sn, and x and y are numbers satisfying $0.08 \leq x < 0.16$ and $0.000001 \leq y < 0.003$)

$$\text{general formula: } (Y_{1-x-y}Eu_xBi_y)_2O_3 \quad (8)$$

(where x and y are numbers satisfying $0.01 \leq x < 0.15$ and $0.001 \leq y < 0.05$)

$$\text{general formula: } (Ca_{1-x-y}Sr_xEu_y)SiAlN_3 \quad (9)$$

(where x and y are numbers satisfying $0 \leq x < 0.4$ and $0 < y < 0.5$)

$$\text{general formula: } (Sr_{1-x}Eu_z)\alpha Si_\beta Al_\gamma O_\delta N_\omega \quad (10)$$

(where x, α, β, γ, δ, and ω are numbers satisfying $0 < x < 1$, $0 < \alpha \leq 3$, $5 \leq \beta \leq 9$, $1 \leq \gamma \leq 5$, $0.5 \leq \delta \leq 2$, and $5 \leq \omega \leq 15$)

As the phosphors, the blue phosphor, the green phosphor, and the red phosphor are cited, but the phosphors are not limited to these. For example, a blue-green phosphor and a deep red phosphor may be used. The use of the aforesaid blue-green phosphor and deep red phosphor as required in addition to the blue phosphor, the green phosphor, and the red phosphor can produce, for example, a white light whose average color rendering index Ra is over 95.

Examples of the blue-green phosphor include a phosphor whose emission peak wavelength is within a range of 460 nm to 490 nm, and desirably a europium (Eu)- and manganese (Mn)-activated alkaline earth silicate phosphor expressed by the formula (11) is used, for instance.

$$\text{general formula: } (Ba_{1-x-y-z-u}Sr_xMg_yEu_zMn_n)_2SiO_4 \quad (11)$$

(where x, y, z, and u are numbers satisfying $0.1 \leq x \leq 0.35$, $0.025 \leq y \leq 0.105$, $0.025 \leq z \leq 0.25$, and $0.0005 \leq u \leq 0.02$)

Examples of the deep red phosphor include a phosphor whose emission peak wavelength is within a range of 630 nm to 780 nm, and desirably a manganese (Mn)-activated magnesium fluorogermanate phosphor having the composition expressed by the formula (12) is used, for instance.

$$\text{general formula: } \alpha MgO \cdot \beta MgF_2 \cdot (Ge_{1-x}Mn_x)O_2 \quad (12)$$

(where α, β, and x are numbers satisfying $3.0 \leq \alpha \leq 4.0$, $0.4 \leq \beta \leq 0.6$, and $0.001 \leq x \leq 0.5$)

By selecting the kinds of the phosphors constituting at least the three primary colors from the aforesaid phosphors and changing the compounding ratio, it is possible to obtain a plurality of kinds of white light sources different in color temperature. The light emitting device of this embodiment has the white light sources having at least two kinds of the color temperatures and appropriately combines the both, thereby capable of producing various mixed white lights whose brightness is controlled.

The resistance element 30 has a function of adjusting the voltage applied to the white light source 12. The resistance element 30 is electrically connected in series to the M pieces of white light emitting diodes 22. Owing to the resistance element 30 in the white light source 12, the voltage applied to the white light source 11 side and the voltage applied to the white light source 12 side become equal to each other at a given current value.

The resistance element 30 has a first resistance value. The resistance value of the resistance element 30 can be appropriately set according to the emission characteristic and so on required of the white light source 12. The resistance element 30 is provided on the same substrate as that where the white light emitting diodes 22 are provided, for instance, but the substrate where to provide the resistance element 30 is not limited to this, and may be a substrate different from that where the white light emitting diodes 22 are provided.

The number of the white light sources is not limited to that in the structure illustrated in FIG. 1 and three white light sources or more may be provided. The three white light sources or more each also include white light emitting diodes electrically connected in series and a resistance element electrically connected in series to the white diodes. In this case, the number of the white light emitting diodes electrically connected in series and the resistance value of the resistance element are set so that a drive current and a drive voltage decrease as the number of the white light sources increases. Further, even when the number of the white light sources increases, it is also possible to supply the current to the white light sources by the same power supply circuit.

For example, in a case where a third white light source is provided in addition to the white light source 11 and the white light source 12, the third white light source includes L pieces (L is a natural number less than M) of third white light emitting diodes electrically connected in series to one another in a forward direction and a second resistance element electrically connected in series to the third white light emitting diodes and having a second resistance value higher than the first resistance value. The third white light source is electrically connected in parallel to the white light source 11 and the white light source 12. Further, the third white light source emits a third white light having a third color temperature lower than the second color temperature and constituting the mixed white light together with the first white light and the second white light. In this case, N is 3 or more and M is 2 or more. Further, the drive voltage of the white light source 12 is higher than a drive voltage of the third white light source.

Brightness of the mixed white light composed of the first white light and the second white light can be adjusted by, for example, the control of the drive currents of the white light emitting diodes 21 and the white light emitting diodes 22 or a phase control method used for toning of ordinary LED light bulbs. At this time, a control pattern of the drive current or a pattern of the phase control can be changed as desired, and in the light emitting device of this embodiment, the white light is controlled so as to be brighter as its color temperature is higher. For example, the above brightness control can be performed by the power supply circuit or other control circuit.

In the light emitting device 1 in FIG. 1, when the current is supplied to the white light source 11 and the white light source 12 and a value of the current is less than the drive current of the white light source 11, the current flows predominantly to the white light source 12, but when the value of the current is equal to or more than the drive current of the white light source 11, the current flows predominantly to the white light source 11. At this time, as an amount of the current supplied to the white light source 11 and the white light source 12 is larger, the total luminous flux of the mixed white light emitted by the light emitting device 1 becomes higher and the color temperature of the emitted white light varies. That is, varying the current amount supplied to the white light source 11 and the white light source 12 can vary the total luminous flux and the color temperature. The total luminous flux can be measured by, for example, an integrating sphere method or goniophotometry.

As described above, the light emitting device of this embodiment uses the plural white light sources which emit the white lights different in color temperature and have different current-voltage characteristics, to emit the mixed white light in which the lights of the plural white light sources are mixed at a desired intensity ratio. This structure enables to produce the mixed white light having a desired intermediate color having a color temperature whose upper limit and lower limit are the color temperatures presented by the plural white light sources. Further, the total luminous flux varies according to the current and as the white light has a higher total luminous flux, it has a higher color temperature (as the white light has a lower total luminous flux, it has a lower color temperature), enabling both the brightness control and the tone control depending on the supplied current.

Second Embodiment

Figure 2:
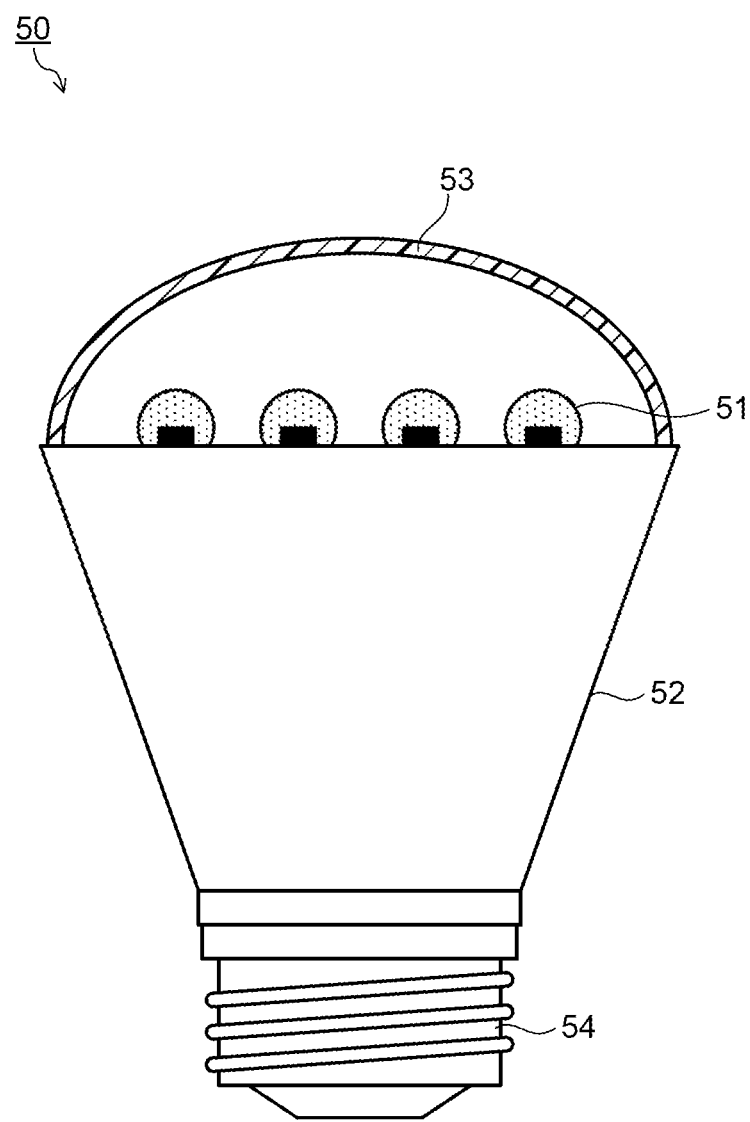
FIG. 2 is a view illustrating a structure example of an LED light bulb.

FIG. 2 is a view illustrating the structure of an LED light bulb. The LED light bulb 50 illustrated in FIG. 2 includes a base 52 on which a light emitting device 51 is provided, a globe 53, and a cap 54. As the light emitting device 51, the light emitting device described in the first embodiment is usable. The base 52 preferably has, for example, a metal material having heat release performance. The globe 53 is attached to the base 52 so as to cover the light emitting device 51. The globe 53 is formed of a material having a light transmitting property such as, for example, glass. The cap 54 is electrically connected to the base 52 and the light emitting device 51. The cap 54 is formed of a conductive material. Incidentally, a lighting circuit may be provided inside the base 52 as a control circuit which controls a current to be supplied to the light emitting device 50.

Figure 3:
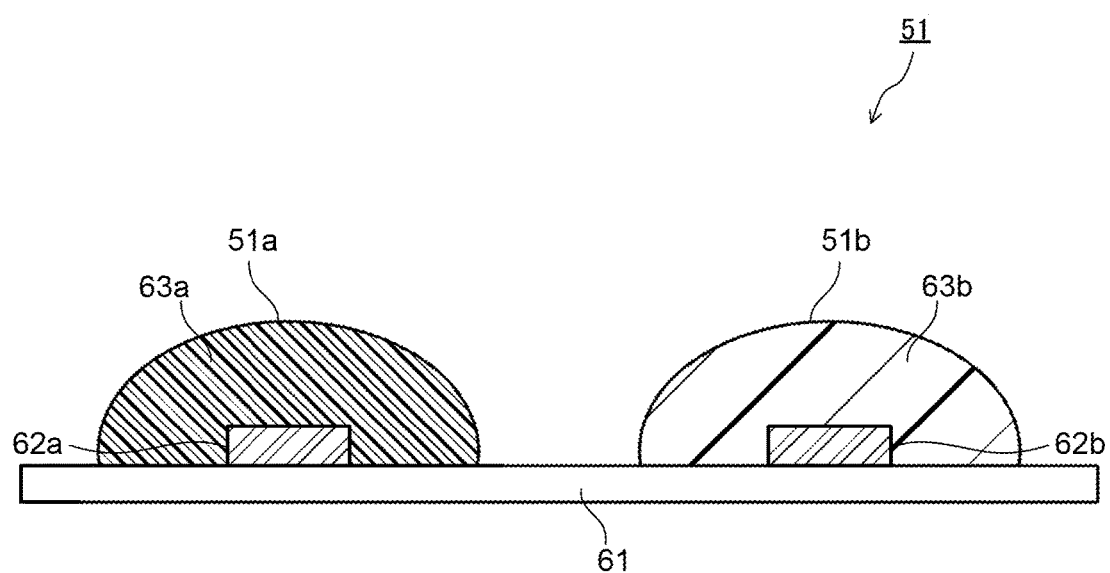
FIG. 3 is a sectional view illustrating a structure example of a light emitting device.

A structure example of the light emitting device 51 will be further described with reference to FIG. 3. FIG. 3 is a schematic cross-sectional view illustrating the structure example of the light emitting device 51 in the LED light bulb. Here, as an example, the light emitting device including the white light source 11 and the white light source 12 will be described.

The light emitting device 51 illustrated in FIG. 3 includes white light emitting diodes 51a and white light emitting diodes 51b which are provided on a substrate 61. The white light emitting diodes 51a correspond to the white light emitting diodes 21 in FIG. 1, and the white light emitting diodes 51b correspond to the white light emitting diodes 22 in FIG. 1. As the substrate 61, a wiring board is usable, for instance, and the white light emitting diodes 51a and the white light emitting diodes 51b may be electrically connected to the wiring board.

The white light emitting diodes 51a each have a light emitting diode element 62a and a phosphor film 63a covering the light emitting diode element 62a. As the white light emitting diode 51a, the white light emitting diode 21 illustrated in FIG. 1 is usable, for instance. Incidentally, as the white light emitting diode 51a, an LED chip having the light emitting diode element 62a and the phosphor film 63a covering the light emitting diode element 62a may be used.

The white light emitting diode 51b has a light emitting diode element 62b and a phosphor film 63b covering the light emitting diode element 62b. Incidentally, as the white light emitting diode 51b, an LED chip having the light emitting diode element 62b and the phosphor film 63b covering the light emitting diode element 62b may be used.

The resistance element 30 illustrated in FIG. 1 can also be formed on the substrate 61, though not illustrated.

Figure 4:
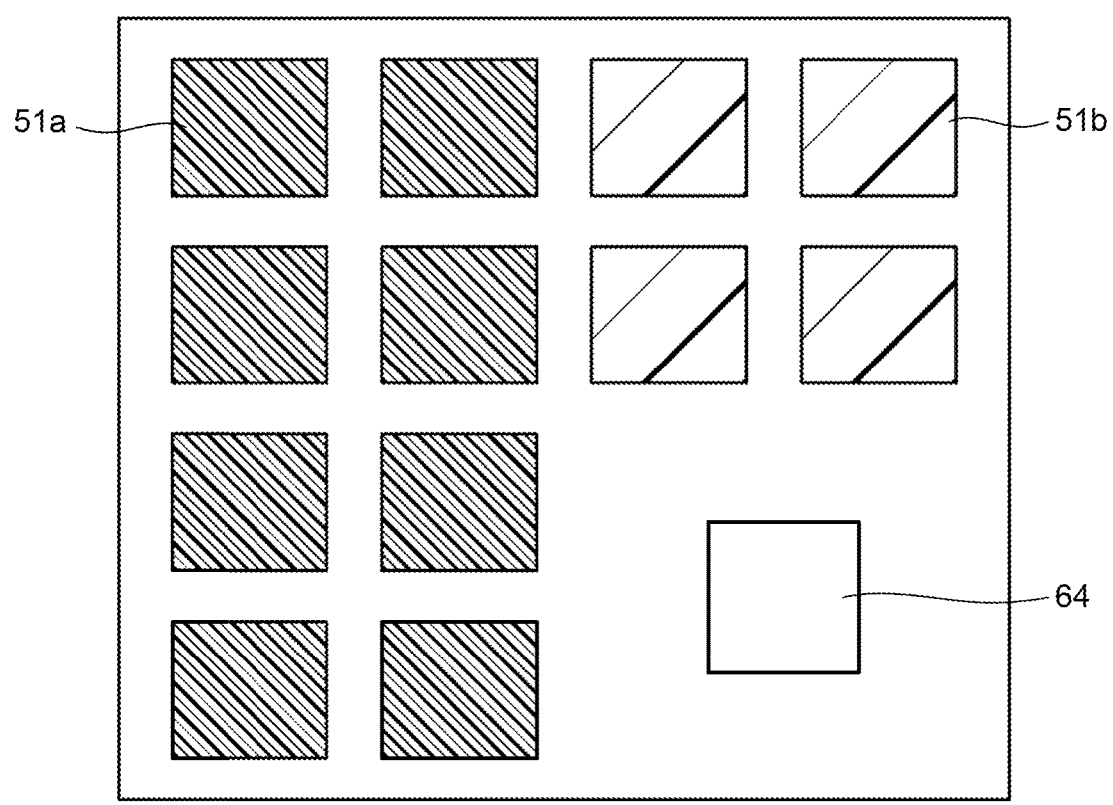
FIG. 4 is a top view illustrating a structure example of the light emitting device.

Further, as illustrated in FIG. 4, the white light emitting diodes 51a, the white light emitting diodes 51b, and a resistance element 64 may be arranged in a matrix on the substrate 61. FIG. 4 is a top view illustrating a structure example of the light emitting device in the LED light bulb of this embodiment. The white light emitting diodes 51a, the white light emitting diodes 51b, and the resistance element 64 may be electrically connected by, for example, the substrate 61 as the wiring board so as to have the connection relation illustrated in FIG. 1.

As described above, the LED light bulb of this embodiment uses the light emitting device of the first embodiment, thereby capable of having both functions of brightness control and tone control.

EXAMPLES

In these examples, LED light bulbs actually fabricated will be described.

Example 1

Figure 5:
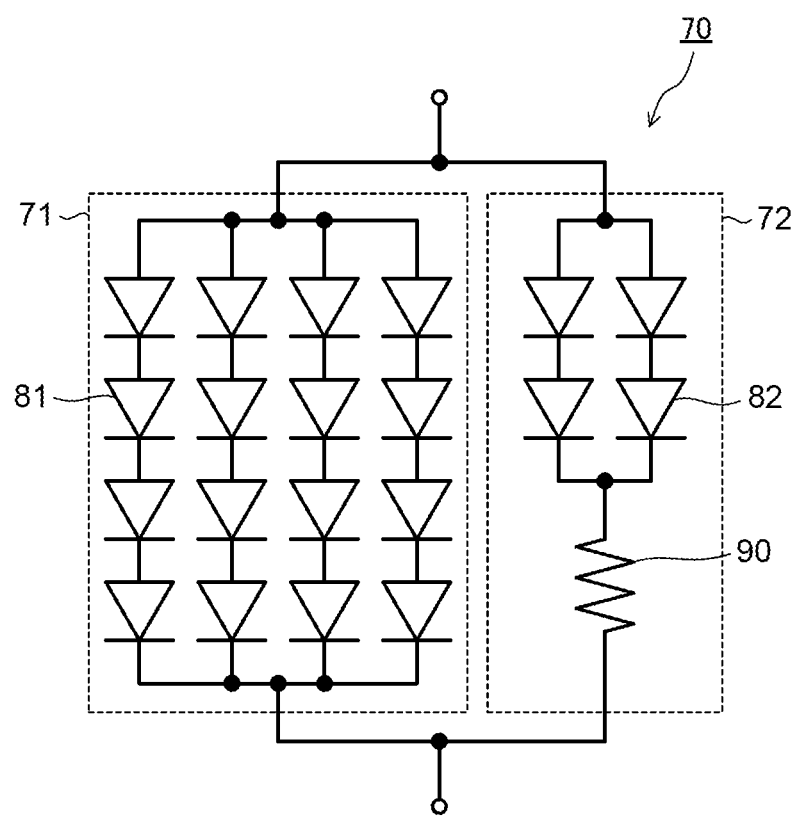
FIG. 5 is a circuit diagram illustrating the circuit configuration of a light emitting device.

FIG. 5 is a circuit diagram illustrating the circuit configuration of a light emitting device in an example 1. The light emitting device 70 illustrated in FIG. 5 includes a white light source 71 and a white light source 72. The white light source 72 is electrically connected in parallel to the white light source 71. The white light source 71 corresponds to the white light source 11 illustrated in FIG. 1, and the white light source 72 corresponds to the white light source 12 illustrated in FIG. 1.

The white light source 71 includes four white light emitting diode groups electrically connected in parallel to one another, the single white light emitting diode group being composed of four white light emitting diodes 81 electrically connected in series to one another in a forward direction. The color temperature of white lights emitted by the white light emitting diodes 81 is 2800 K.

The white light source 72 includes two white light emitting diode groups electrically connected in parallel to each other, the single white light emitting diode group being composed of two white light emitting diodes 82 electrically connected in series to each other in a forward direction. The color temperature of white lights emitted by the white light emitting diodes 82 is 2000 K. The white light source 72 further includes a resistance element 90 electrically connected in series to the white light emitting diodes 82. As the resistance element 90, a variable resistance element was used, with the intention to study how an emission characteristic varies as a resistance value varies.

The LED light bulb as described in the second embodiment was fabricated using the above-described light emitting device. The emission characteristic of the LED light bulb in the example 1 will be described.

Figure 6:
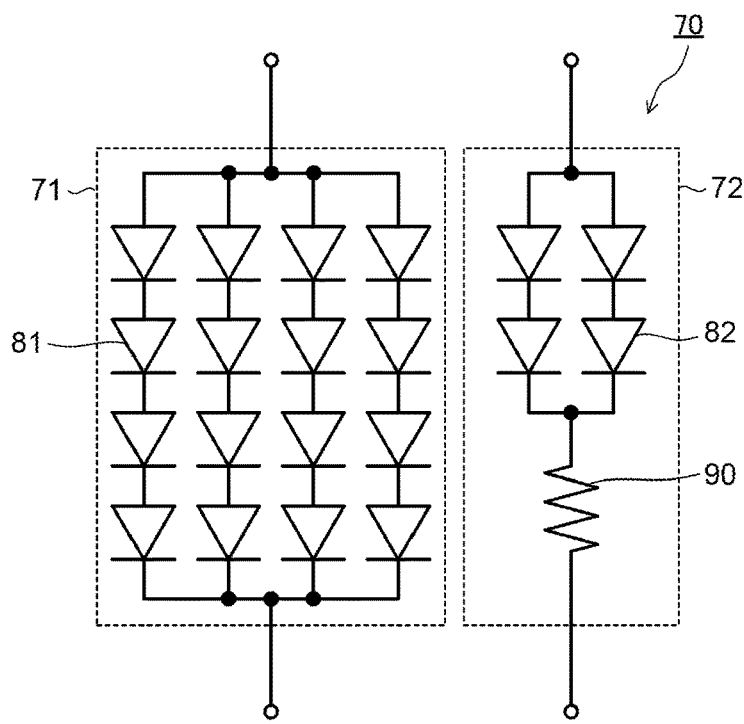
FIG. 6 is a circuit diagram used to explain an emission characteristic of the light emitting device.
Figure 7:
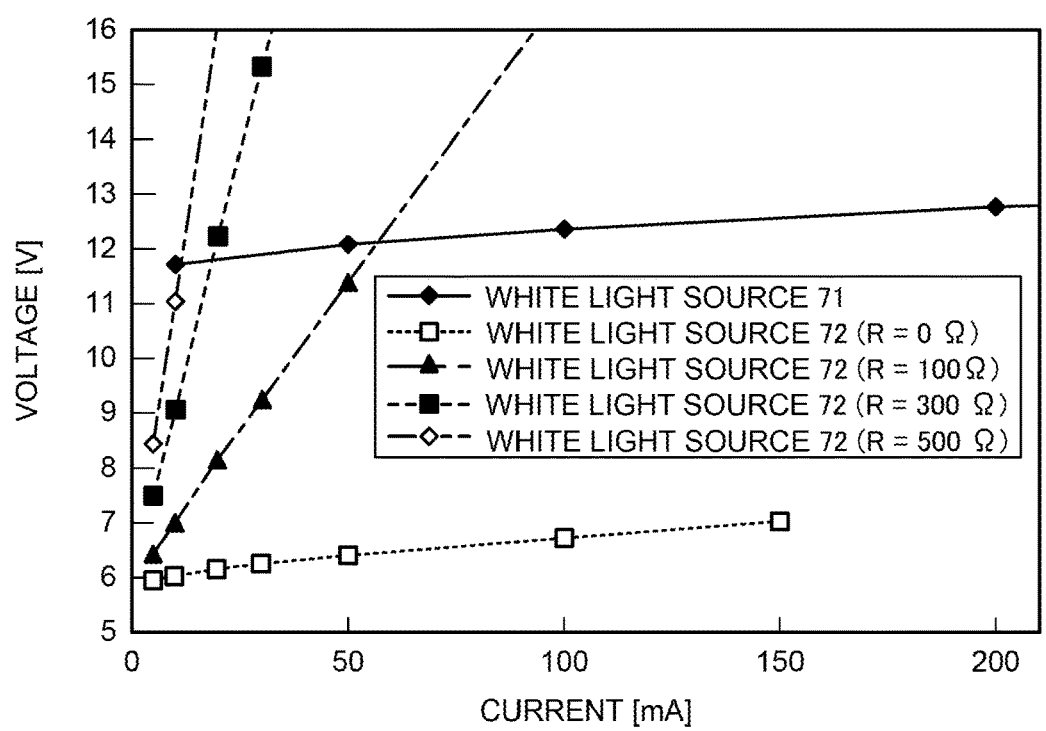
FIG. 7 is a chart illustrating current-voltage relations of the light emitting device.

First, for comparison, FIG. 7 illustrates an example of an emission characteristic of a light emitting device where the white light source 71 and the white light source 72 are not electrically connected in parallel as illustrated in FIG. 6.

When the resistance value of the resistance element 90 is 0 ohm, a voltage applied when a current is supplied to the white light source 71 is lower than a voltage applied when the current is supplied to the white light source 72. Further, a line connecting voltage values of the white light source 71 does not intersect with a line connecting voltage values of the white light source 72.

On the other hand, when the resistance value of the resistance element 90 is 100 ohm, 300 ohm, and 500 ohm, voltages applied to the white light source 72 are higher than when the resistance value of the resistance element 90 is 0 ohm, and the line connecting the voltage values of the white light source 71 intersects with lines connecting voltage values of the white light source 72.

Figure 8:
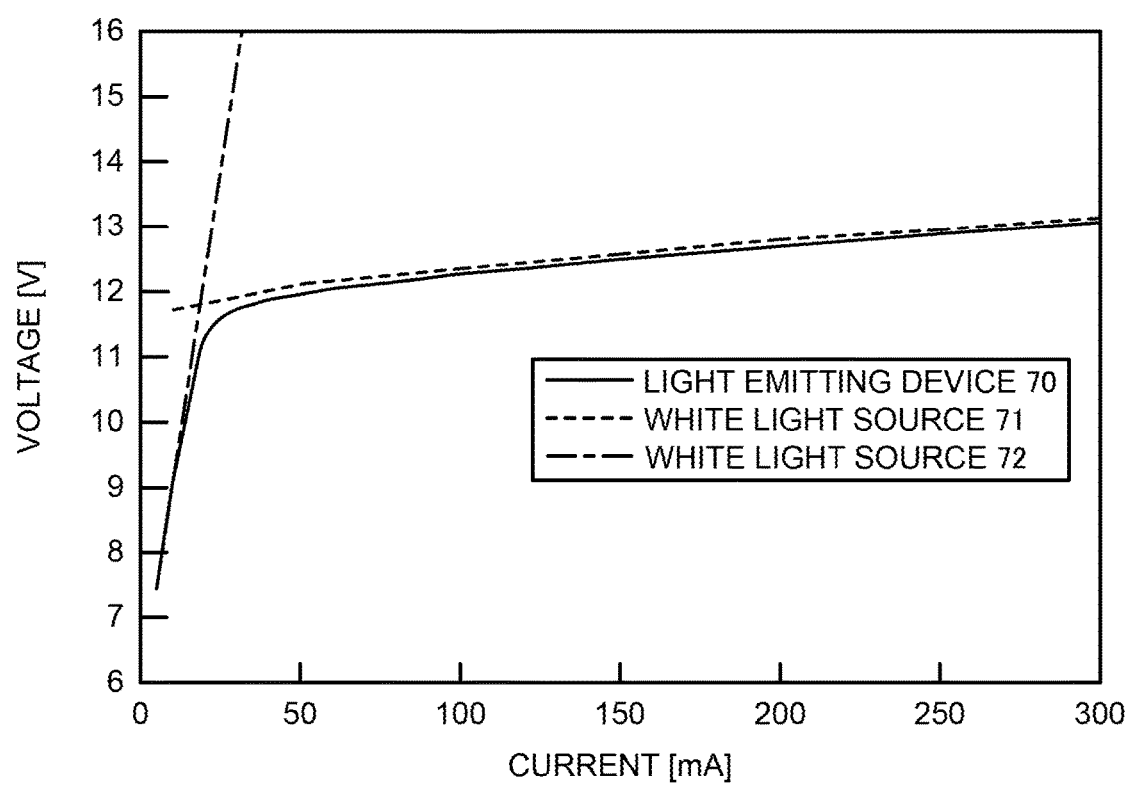
FIG. 8 is a chart illustrating current-voltage relations of the light emitting device.
Figure 9:
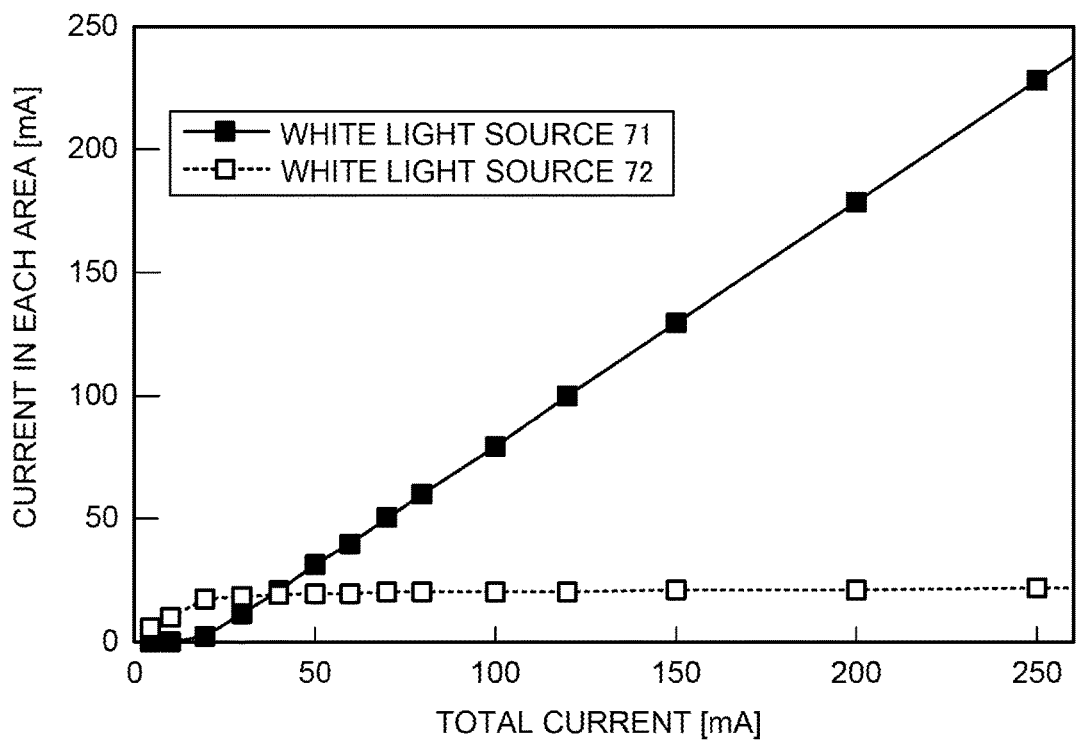
FIG. 9 is a chart illustrating a current characteristic of the light emitting device.

Further, FIG. 8 illustrates current-voltage relations of the light emitting device in the example 1 when the resistance value of the resistance element 90 is 300 ohm. FIG. 9 illustrates relations between a current supplied to the whole light emitting device and currents flowing in the white light sources. As illustrated in FIG. 8, in the light emitting device 70 in the example 1, a gradient of a line connecting voltage values is relatively large when a current value is up to 20 mA. This is because the current flows predominantly to the white light source 72 as illustrated in FIG. 9. Further, as illustrated in FIG. 8, when the current value is over 20 mA, the gradient of the line connecting the voltage values becomes relatively small and a voltage of the white light source 71 and a voltage of the white light source 72 become equal to each other. This is because the current flowing in the white light source 72 is saturated and the current flows predominantly to the white light source 71 as illustrated in FIG. 9. Incidentally, the coordinates at the same current value as that at a point of intersection of a line connecting voltage values of the white light source 72 and a line connecting voltage values of the white light source 71 which are illustrated in FIG. 8 correspond to a point of inflection in the line connecting the voltage values of the whole light emitting device 70.

Figure 10:
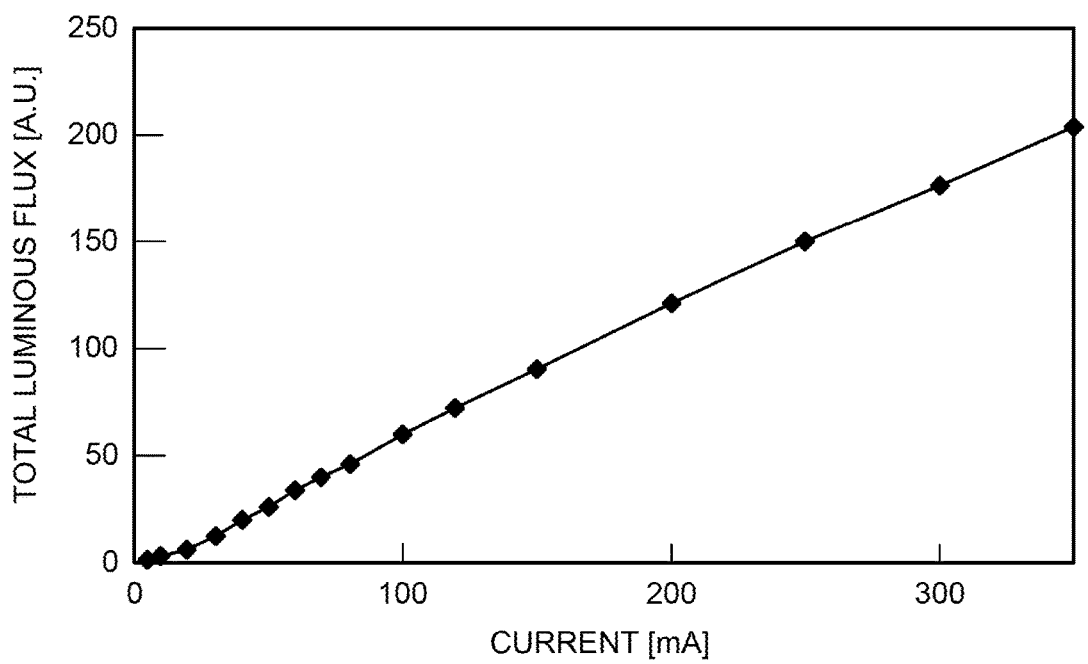
FIG. 10 is a chart illustrating a current-total luminous flux relation of the light emitting device.

Further, FIG. 10 illustrates a relation between the current supplied to the light emitting device of the example 1 and the total luminous flux. FIG. 10 shows that the total luminous flux increases as the current supplied to the light emitting device increases. This shows that the total luminous flux of the light emitting device of the example 1 can be adjusted by the adjustment of the current amount.

Example 2

Figure 11:
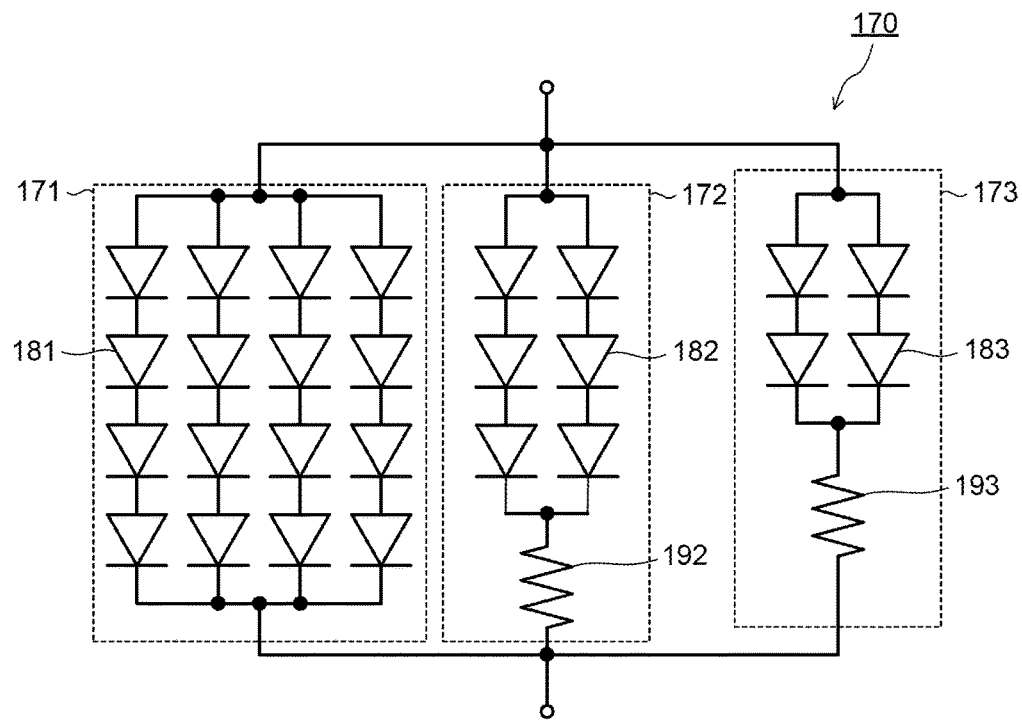
FIG. 11 is a circuit diagram illustrating the circuit configuration of a light emitting device.

FIG. 11 is a circuit diagram illustrating the circuit configuration of a light emitting device in an example 2. The light emitting device 170 illustrated in FIG. 11 includes a white light source 171, a white light source 172, and a white light source 173. The white light source 172 and the white light source 173 are electrically connected in parallel to the white light source 171. The white light source 171 corresponds to the white light source 71 illustrated in FIG. 5, and the white light source 173 corresponds to the white light source 72 illustrated in FIG. 5.

The white light source 171 includes four white light emitting diode groups electrically connected in parallel to one another, the single white light emitting diode group being composed of four white light emitting diodes 181 electrically connected in series to one another in a forward direction. The color temperature of white lights emitted by the white light emitting diodes 181 is 2800 K.

The white light source 172 includes two white light emitting diode groups electrically connected in parallel to each other, the single white light emitting diode group being composed of three white light emitting diodes 182 electrically connected in series to one another in a forward direction. The color temperature of white lights emitted by the white light emitting diodes 182 is 2400 K. The white light source 172 further includes a resistance element 192 electrically connected in series to the white light emitting diodes 182. As the resistance element 192, a variable resistance element was used, with the intention to study how an emission characteristic varies as a resistance value varies.

The white light source 173 includes two white light emitting diode groups electrically connected in parallel to each other, the single white light emitting diode group being composed of two white light emitting diodes 183 electrically connected in series to each other in a forward direction. The color temperature of white lights emitted by the white light emitting diodes 183 is 2000 K. The white light source 173 further includes a resistance element 193 electrically connected in series to the white light emitting diodes 183. As the resistance element 193, a variable resistance element was used, with the intention to study how an emission characteristic varies as a resistance value varies.

The LED light bulb as described in the second embodiment was fabricated using the above-described light emitting device. The emission characteristic of the LED light bulb in the example 2 will be described.

Figure 12:
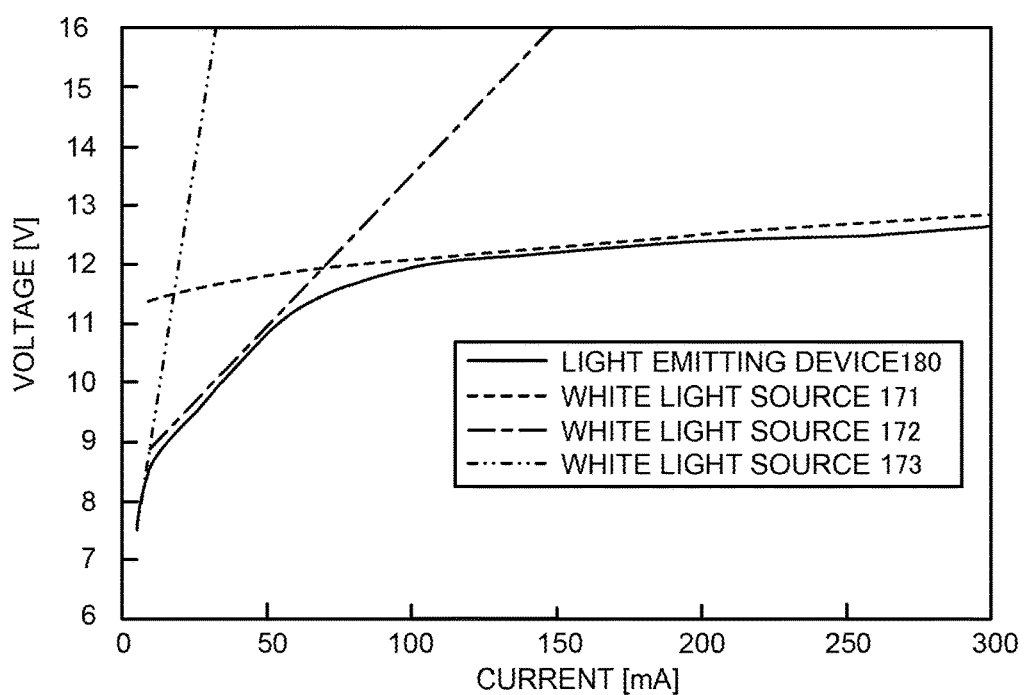
FIG. 12 is a chart illustrating current-voltage relations of the light emitting device.

FIG. 12 illustrates current-voltage relations of the tight emitting device in the example 2 when the resistance value of the resistance element 192 is 50 ohm and the resistance value of the resistance element 193 is 300 ohm. In the light emitting device 180 in the example 2, a gradient of a line connecting voltage values is largest when a current value is up to 20 mA. This indicates that a current flows predominantly to the white light source 173. Further, when the current value is over 20 mA up to 60 mA, a gradient of the line connecting the voltage values is smaller than the gradient when the current value is up to 20 mA, and a voltage of the white light source 172 and a voltage of the white light source 173 become equal to each other. This indicates that the current flowing in the white light source 173 is saturated and the current flows predominantly to the white light source 172. Further, when the current value is over 60 mA, a gradient of the line connecting the voltage values is still smaller than the gradient when the current value is up to 60 mA, and a voltage of the white light source 171 and the voltage of the white light source 172 become equal to each other. This indicates that the current flowing in the white light source 172 is saturated and the current flows predominantly to the white light source 171. Incidentally, the coordinates at the same current value as that at a point of intersection of a line connecting voltage values of the white light source 173 and a line connecting voltage values of the white light source 172 which are illustrated in FIG. 12 correspond to a first point of inflection, and the same coordinates as a point of intersection of the line connecting the voltage values of the white light source 172 and a line connecting voltage values of the white light source 171 correspond to a second point of inflection Thus increasing the number of the points of inflection enables to express the current-voltage characteristic with a smoother curve.

Comparative Example 1 and Comparative Example 2

An ordinary LED light bulb which emits a white light with a 2800 K color temperature was prepared as a comparative example 1, and an incandescent light bulb was prepared as a comparative example 2. Differences of their emission characteristics from those of the example 1 and the example 2 were found by comparison.

Figure 13:
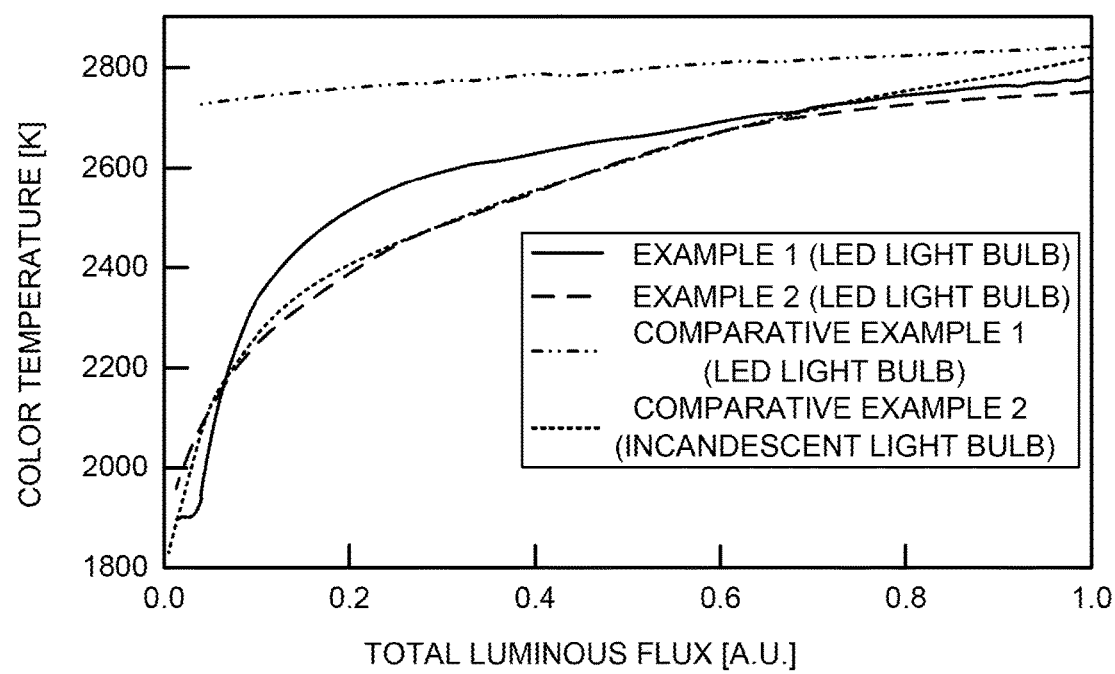
FIG. 13 is a chart illustrating total luminous flux-color temperature relations of the light emitting devices.

FIG. 13 illustrates total luminous flax-color temperature relations in the example 1, the example 2, the comparative example 1, and the comparative example 2. As is seen from FIG. 13, in the comparative example 1, the color temperature varies only within a range of not less than 2600 K nor more than 2800 K even when the total luminous flax varies, whereas, in the example 1 and the example 2, the color temperature varies in a wide range of not less than 1800 K nor more than 2800 K as the total luminous flux varies. It is also seen that the emission characteristics of the example 1 and the example 2 approximate the emission characteristic of the comparative example 2 which is the incandescent light bulb. It is also seen that the emission characteristic of the example 2 more approximates the emission characteristic of the comparative example 2 which is the incandescent light bulb than the example 1. This shows that increasing the number of the points of inflection in the current-voltage characteristic by increasing the number of the white light sources each having the resistance element and electrically connected in parallel can make the emission characteristic more approximate a desired characteristic.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device comprising:
a first white light source, including N pieces, with N being a natural number equal to or more than 2, of first white light emitting diodes electrically connected in series to one another in a forward direction, and emitting a first white light having a first color temperature;
a second white light source, including M pieces, with M being a natural number less than N, of second white light emitting diodes electrically connected in series to one another in a forward direction and a first resistance element electrically connected in series to the second white light emitting diodes and having a first resistance value, the second white light source being electrically connected in parallel to the first white light source, and emitting a second white light having a second color temperature lower than the first color temperature; and
a control circuit,
the device emitting a mixed white light of the first white light and the second white light,
wherein each of the first and second white light emitting diodes includes:
a light emitting diode element which emits light having an emission peak wavelength in a range of from 370 nm to 420 nm; and
a phosphor which emits white light by being excited by the light of the light emitting diode element, consisting of a blue phosphor, a green phosphor, and a red phosphor, each of the blue, green, and red phosphors containing at least one element selected from the group consisting of europium and cerium, wherein a drive voltage of the first white light source is higher than a drive voltage of the second white light source, and
wherein the control circuit controls a current to be supplied to the first and second white light sources so that a color temperature of the mixed white light is higher as a total luminous flux of the mixed white light is higher.

2. The device according to claim 1,
wherein, in the CIE chromaticity diagram, a Cx difference between the first white light source and the second white light source is 0.04 or more, and a Cy difference between the first white light source and the second white light source is 0.001 or more.

3. The device according to claim 1,
wherein the blue phosphor including a europium (Eu)-activated alkaline earth chlorophosphate phosphor having a composition expressed by a general formula: $(Sr_{1-x-y-z}Ba_xCa_yEu_z)_5(PO_4)_3 \cdot Cl$ (1)

where x, y, and z are numbers satisfying $0 \leq x < 0.5$, $0 \leq y < 0.1$, and $0.005 \leq z < 0$,
the green phosphor including at least one selected from:
a europium (Eu)- and manganese (Mn)-activated alkaline earth aluminate phosphor having a composition expressed by a general formula: $(Ba_{1-x-y-z}Sr_xCa_yEu_z)(Mg_{1-u}Mn_u)Al_{10}O_{17}$ (2)

where x, y, z, and u are numbers satisfying $0 \leq x < 0.2$, $0 \leq y < 0.1$, $0.005 < z < 0.5$, and $0.1 < u < 0.5$;
a europium (Eu)- and manganese (Mn)-activated alkaline earth silicate phosphor having a composition expressed by a general formula: $(Sr_{1-x-y-z-u}Ba_xMg_yEu_zMn_u)_2SiO_4$ (3)

where x, y, z, and u are numbers satisfying $0.1 \leq x \leq 0.35$, $0.025 \leq y \leq 0.105$, $0.025 \leq z \leq 0.25$, and $0.0005 \leq u \leq 0.02$;
a cerium (Ce)-activated rare-earth aluminate phosphor having a composition expressed by a general formula: $RE_3A_xAl_{5-x-y}B_yO_{12}:Ce_z$ (4)

where RE represents at least one kind of element selected from Y, Lu, and Gd, A and B are elements making a pair, (A, B) is one of (Mg, Si), (B, Sc), and (B, In), and x, y, and z are numbers satisfying $x < 2$, $y < 2$, $0.9 \leq x/y \leq 1.1$, and $0.05 \leq z \leq 0.5$;
a europium (Eu)-activated sialon phosphor having a composition expressed by a general formula: $(Si,Al)_6(O,N)_8:Eu_x$ (5)

where x is a number satisfying $0 < x < 0.3$; and
a europium (Eu)-activated sialon phosphor having a composition expressed by a general formula: $(Sr_{1-x}Eu_x)_\alpha Si_\beta Al_\gamma O_\delta N_\omega$ (6)

where x, $\alpha$, $\beta$, $\gamma$, $\delta$, and $\omega$ are numbers satisfying $0 < x < 1$, $0 < \alpha \leq 3$, $12 \leq \beta \leq 14$, $2 \leq \gamma \leq 3.5$, $1 \leq \delta \leq 3$, and $20 \leq \omega \leq 22$, and
the red phosphor including at least one selected from:
a europium (Eu)-activated lanthanum oxysulfide phosphor having a composition expressed by a general formula: $(La_{1-x-y}Eu_xM_y)_2O_2S$ (7)

where M represents at least one kind of element selected from Sm, Ga, Sb, and Sn, and x and y are numbers satisfying $0.08 \leq x < 0.16$ and $0.000001 \leq y < 0.003$;
a europium (Eu)- and bismuth (Bi)-activated yttrium oxide phosphor having a composition expressed by a general formula: $(Y_{1-x-y}Eu_xBi_y)_2O_3$     (8)

where x and y are numbers satisfying $0.01 \leq x < 0.15$ and $0.001 \leq y < 0.05$;

a europium (Eu)-activated CASN phosphor having a composition expressed by a general formula: $(Ca_{1-x-y}Sr_xEu_y)SiAlN_3$     (9)

where x and y are numbers satisfying $0 \leq x < 0.4$ and $0 < y < 0.5$; and a europium (Eu)-activated sialon phosphor having a composition expressed by a general formula: $(Sr_{1-x}Eu_z)\alpha Si_\beta Al_\gamma O_\delta N_\omega$     (10)

where x, $\alpha$, $\beta$, $\gamma$, $\delta$, and $\omega$ are numbers satisfying $0 < x < 1$, $0 < \alpha \leq 3$, $5 \leq \beta \leq 9$, $1 \leq \gamma \leq 5$, $0.5 \leq \delta \leq 2$, and $5 \leq \omega \leq 15$.

4. The device according to claim 1, further comprising a third white light source, including L pieces, with L being a natural number less than M of third white light emitting diodes electrically connected in series to one another in a forward direction and a second resistance element electrically connected in series to the third white light emitting diodes and having a second resistance value higher than the first resistance value, the third white light source being electrically connected in parallel to the first white light source and the second white light source, emitting a third white light having a third color temperature lower than the second color temperature, and constituting the mixed white light together with the first white light and the second white light, wherein the N is 3 or more, and the M is 2 or more, and wherein the drive voltage of the second white light source is higher than a drive voltage of the third white light source.

5. The device according to claim 1, wherein the color temperature of the mixed white light is variable within a range of 1800 K to 2800 K.

6. An LED light bulb comprising:

a base having a surface having the light emitting device according to claim 1;

a globe provided on the base to cover the light emitting device; and a cap electrically connected to the base and the light emitting device.

7. The bulb according to claim 6, wherein the control circuit is provided inside the base.

8. The device according to claim 1, wherein the first resistance element is connected to a cathode of the second white light emitting diode on the Mth stage.

9. The device according to claim 1, wherein the total luminous flux is higher as the current is higher.

10. A light emitting device comprising:

a first white light source, including N pieces, with N being a natural number equal to or more than 2, of first white light emitting diodes electrically connected in series to one another in a forward direction, and emitting a first white light having a first color temperature;

a second white light source, including M pieces, with M being a natural number less than N, of second white light emitting diodes electrically connected in series to one another in a forward direction and a first resistance element electrically connected in series to the second white light emitting diodes and having a first resistance value, the second white light source being electrically connected in parallel to the first white light source, and emitting a second white light having a second color temperature lower than the first color temperature; and a control circuit, the device emitting a mixed white light of the first white light and the second white light, wherein each of the first and second white light emitting diodes includes:

a light emitting diode element which emits light having an emission peak wavelength in a range of from 370 nm to 420 nm; and a phosphor which emits white light by being excited by the light of the light emitting diode element, including a blue phosphor, a green phosphor, a red phosphor, and a blue-green phosphor, each of the blue, green, and red phosphors containing at least one element selected from the group consisting of europium and cerium, wherein a drive voltage of the first white light source is higher than a drive voltage of the second white light source, and wherein the control circuit controls a current to be supplied to the first and second white light sources so that a color temperature of the mixed white light is higher as a total luminous flux of the mixed white light is higher.

11. The device according to claim 10, wherein the green phosphor includes a cerium (Ce)-activated rare-earth aluminate phosphor or a europium (Eu)- and manganese (Mn)-activated alkaline earth silicate phosphor.

12. The device according to claim 10, wherein the red phosphor includes a europium (Eu)-activated CASN phosphor or a europium (Eu)- and bismuth (Bi)-activated yttrium oxide phosphor.

13. The device according to claim 10, wherein the blue-green phosphor includes a europium (Eu)- and manganese (Mn)-activated alkaline earth silicate phosphor.

14. The device according to claim 10, wherein the phosphor further includes a deep red phosphor.

\* \* \* \* \*